(12) United States Patent
Shen

(10) Patent No.: US 8,487,339 B2
(45) Date of Patent: Jul. 16, 2013

(54) LIGHT-EMITTING DIODE CHIP PACKAGE BODY AND METHOD FOR MANUFACTURING SAME

(76) Inventor: Yu-Nung Shen, Taipei (TW)

( * ) Notice: Subject to any disclaimer, the term of this patent is extended or adjusted under 35 U.S.C. 154(b) by 0 days.

(21) Appl. No.: 13/206,920

(22) Filed: Aug. 10, 2011

(65) Prior Publication Data

US 2011/0291155 A1 Dec. 1, 2011

Related U.S. Application Data

(62) Division of application No. 12/186,070, filed on Aug. 5, 2008, now Pat. No. 8,017,968.

(30) Foreign Application Priority Data

May 16, 2008 (TW) ................................ 97118327 A

(51) Int. Cl.
*H01L 33/00* (2010.01)

(52) U.S. Cl.
USPC ............... 257/99; 257/678; 257/675; 257/79; 257/103; 257/E51.018; 257/E33.001; 257/E33.058

(58) Field of Classification Search
USPC .................... 257/99, E33.058, 676, 678, 675, 257/E51.018; 438/26
See application file for complete search history.

(56) References Cited

U.S. PATENT DOCUMENTS

| | | | |
|---|---|---|---|
| 4,476,620 A * | 10/1984 | Ohki et al. ....................... | 438/33 |
| 5,546,496 A | 8/1996 | Kimoto et al. | |
| 2005/0286264 A1 | 12/2005 | Kim et al. | |
| 2006/0084191 A1 | 4/2006 | Hwan | |
| 2008/0038535 A1 | 2/2008 | Fukushima | |
| 2008/0239724 A1 | 10/2008 | Moriyama et al. | |
| 2008/0246054 A1 * | 10/2008 | Suzuki ........................... | 257/103 |
| 2009/0116193 A1 * | 5/2009 | Lin ................................ | 361/706 |
| 2012/0052279 A1 * | 3/2012 | Sung ............................. | 428/220 |

* cited by examiner

*Primary Examiner* — Marc Armand
(74) *Attorney, Agent, or Firm* — Houston & Associates, LLP

(57) ABSTRACT

A light-emitting diode chip package body with an excellent heat dissipation performance and a low manufacturing cost, and a packaging method of the same are disclosed. A LED chip package body is provided, the LED chip package body comprising: a LED chip having an electrode-side surface and at least two electrodes mounted on said electrode-side surface; an electrode-side insulating layer formed on said electrode-side surface of said LED chip and formed with a plurality of through-holes registered with corresponding said electrodes; a highly heat-dissipating layer formed in each of said through-holes of said insulating layer on said electrode-side surface; and a highly heat-conducting metal layer formed on said highly heat-dissipating layer in each of said through-holes.

11 Claims, 10 Drawing Sheets

LIGHT-EMITTING DIODE CHIP PACKAGE BODY AND METHOD FOR MANUFACTURING SAME

RELATED APPLICATIONS

This application is a Divisional of U.S. patent application Ser. No. 12/186,070 filed on Aug. 5, 2008 which claims priority to Taiwanese Patent Application Number 97118327 filed on May 16, 2008, both of which are incorporated herein by reference in their entirety.

FIELD OF THE INVENTION

The present invention relates to a light-emitting diode chip, and more particularly, to a light-emitting diode chip package body with an excellent heat dissipation performance and a low manufacturing cost, and a method for manufacturing the same.

BACKGROUND OF THE INVENTION

FIG. 19 is a schematic side view showing a conventional light-emitting diode (LED) chip package body. FIG. 20 is a schematic view showing the bin distribution of light-emitting diode chip package bodies in which the LED chips used have the same wavelength and same brightness.

Referring to FIG. 19, the conventional light-emitting diode (LED) chip package body includes an LED chip 91 mounted on a lead frame 90, and an lens 92 formed on the lead frame 90 so as to cover the LED chip 91.

The electrodes (not shown) of the LED chip 91 are connected electrically to the corresponding legs 900 of the lead frame 90 via wires 93.

It should be noted that a fluorescent layer 94 is formed on an electrode-side surface of the LED chip 91. The formation of the layer 94 is achieved by the following steps: coating the electrode-side surface of the LED chip 91 with liquid fluorescent layer material; and curing the liquid fluorescent layer material by baking process so as to form the fluorescent layer 94.

SUMMARY OF THE INVENTION

However, the formation of the fluorescent layer 94 has the following drawbacks:

Uneven thickness—flowing of the liquid fluorescent layer material in all directions may occur before the baking process, therefore, the thickness of the fluorescent layer formed on each LED chip 91 will be different.

Different area—as mentioned above, the area of the fluorescent layer formed on each LED chip 91 will therefore be different.

Different shape—as mentioned above, the shape of the fluorescent layer formed on each LED chip 91 will therefore also be different.

Relative position offset—as mentioned above, the relative position of the fluorescent layer formed on each LED chip 91 to the corresponding LED chip 91 will therefore be different.

Due to the aforementioned drawbacks, the LED chip package bodies will therefore be classified to many bins, although the LED chips used in the LED chip package bodies have the same brightness and the same wavelength.

On the other hand, since the sectional area of the wire 93 is too small, the heat generated by the LED chip 91 is hard to dissipate via the legs 900 of the lead frame 90, which in turn lower the efficiency of the LED chip package body.

The object of the present invention is to provide a light-emitting diode chip package body with an excellent heat dissipation performance and a low manufacturing cost, and a packaging method of the same.

According to one aspect of the present invention, a LED chip package body is provided, the LED chip package body comprising: a LED chip having an electrode-side surface and at least two electrodes mounted on said electrode-side surface; an electrode-side insulating layer formed on said electrode-side surface of said LED chip and formed with a plurality of through-holes registered with corresponding said electrodes; a highly heat-dissipating layer formed in each of said through-holes of said insulating layer on said electrode-side surface; and a highly heat-conducting metal layer formed on said highly heat-dissipating layer in each of said through-holes.

According to another one aspect of the present invention, a method for manufacturing a LED chip package body is provided, the method comprising the steps of: preparing a LED wafer having a plurality of LED chips, each of said LED chips having a main light-emitting surface, said main light-emitting surfaces of said LED chips cooperatively serving as a main light-emitting surface of said LED wafer; forming a light-emitting surface-side insulating layer on said main light-emitting surface of said LED wafer; forming a plurality of vias each reaching said main light-emitting surface of a corresponding one of said LED chips in said insulating layer; and forming a fluorescent layer in each of said vias on said main light-emitting surface of said LED chip.

According to still another one aspect of the present invention, a LED chip package body is provided, the LED chip package body comprising: a pair of electrode terminals; and a LED chip having a first electrode-side surface on which a first electrode is formed and a second electrode-side surface on which a second electrode is formed, said first and second electrodes having opposite conductivity, said LED chip supported by said electrode terminals in a manner that said electrodes on said first and second electrode-side surfaces electrically contact with contact of corresponding electrode terminals, said electrode-side surface of said LED chip coated with a diamond-like film.

According to yet another one aspect of the present invention, a light-emitting module is provided, the light-emitting module comprising: a light-emitting assembly including an elongated printed circuit board on which a plurality of LED chip package bodies, as described above, is mounted in flip-chip manner; and a light-guiding assembly including a diffusion plate mounted on said printed circuit board, said diffusion plate having a surface which faces said printed circuit board and which is formed with a plurality of recess portions adapted to accommodate corresponding said LED chip package bodies on said printed circuit board.

According to another one aspect of the present invention, a method for manufacturing a LED chip package body is provided, the method comprising the steps of: providing a LED wafer having a plurality of LED chips, each of said LED chips having an electrode-side surface and at least two electrodes mounted on said electrode-side surface, said electrode-side surfaces of said LED chips cooperatively serving as an electrode-side surface of said LED wafer; forming an electrode-side insulating layer on said electrode-side surface of said LED wafer, said electrode-side insulating layer being patterned so as to form with a plurality of through-holes each registered with a corresponding one of said electrodes of said LED chips; forming a highly heat-dissipating layer on said electrode-side insulating layer so as to cover said electrodes of said LED chips exposed by said through-holes of said insulating layer; forming a first metal layer on said highly heat-dissipating layer; forming a second metal layer on said first metal layer; and forming a third metal layer on said second metal layer.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Preferred embodiments of the present invention will be described below with reference to the accompanying drawings.

It should be noted that the same numeral is used to indicate the same element throughout the whole specification. Furthermore, the elements are not drawn to scale so as to clearly show the features of the present invention.

Figure 1:
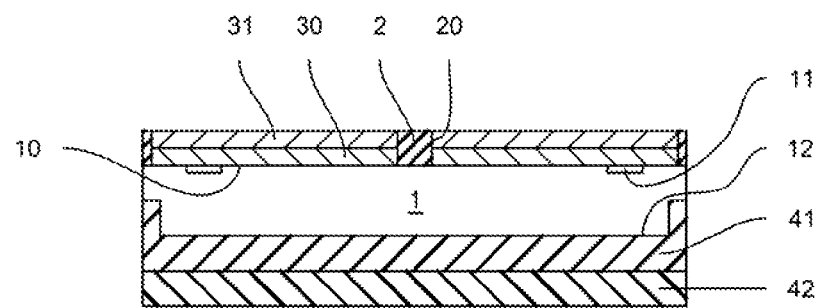
FIG. 1 is a schematic sectional view illustrating a light-emitting diode chip package body according to a first embodiment of the present invention.
Figure 2:
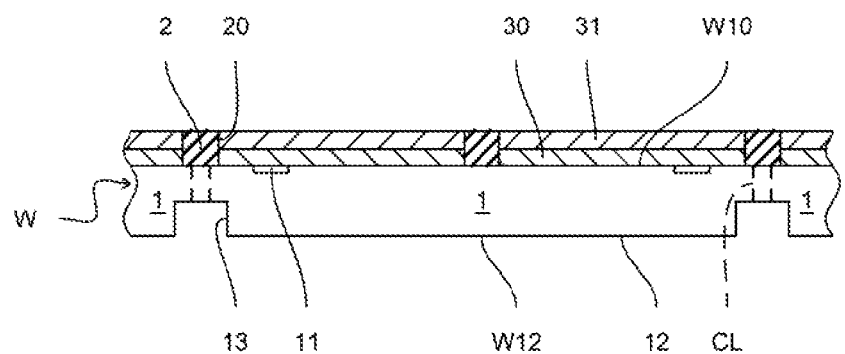
FIGS. 2 to 3 are schematic sectional views illustrating a method for manufacturing the light-emitting diode chip package body shown in FIG. 1.
Figure 3:
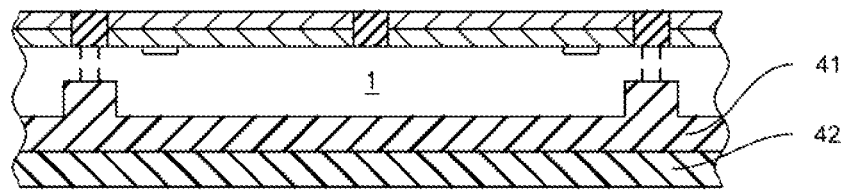

FIG. 1 is a schematic sectional view showing a light-emitting diode (LED) chip package body according to a first embodiment of the present invention, and FIGS. 2 and 3 are schematic sectional views showing a method for manufacturing the LED chip package body shown in FIG. 1.

Referring to FIGS. 1 to 3, an electrode-side insulating layer 2 is formed on an electrode-side surface W10 of a LED wafer W having a plurality of LED chips 1. Each of the LED chips 1 has an electrode-side surface 10 on which at least two electrodes 11 are mounted. The electrode-side surfaces 10 of the LED chips 1 cooperatively serve as the electrode-side surface W10 of the LED wafer W. The insulating layer 2 is formed with a plurality of through-holes 20 which expose the corresponding electrodes 11 of the LED chips 1 of the LED wafer W. A highly heat-dissipating layer 30 and a highly heat-conducting metal layer 31 formed on the highly heat-dissipating layer 30 are sequentially formed in each of the through-holes 20 in this order. It should be noted that the layers 30,31 can be formed by a sputtering process followed by a chemical mechanical polishing (CMP) process which removes the parts of the layers 30,31 on the insulating layer 2.

Figure 11:
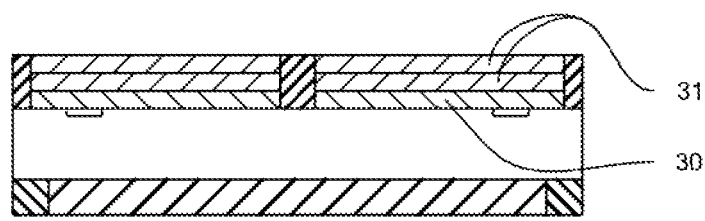
FIG. 11 is a schematic sectional view illustrating an alternative of said light-emitting diode chip package body according to the second embodiment of the present invention.

In the present embodiment, the highly heat-dissipating layer 30 is formed of a material having a heat-dissipating coefficient of greater than 400 Watts per meter-Kelvin (W/(m·k)) such as 400 W/(m·k) to 700 W/(m·k) provided by pyrolytic graphite, or a material having a heat-dissipating coefficient of 900 W/(m·k) to 1200 W/(m·k) such as diamond-like carbon. On the other hand, the metal layer 31 may be composed of a Ni layer and an Au layer, or an Al layer and a Cu layer, as shown in FIG. 11. Alternatively, the metal layer 31 is composed of a Cu layer. Alternatively, the metal layer 31 may be composed of any suitable metal layer or alloy layer thereof, such as A1, $AlN_3$, Cu, BN3, etc.

Subsequently, a plurality of grooves 13 is formed on a light-emitting surface W12 opposed to the electrode-side surface W10 of the LED wafer W along the corresponding cutting lines CL.

Then, as shown in FIG. 3, a fluorescent layer 41 and a protection layer 42 are sequentially formed on the surface W12 of the LED wafer W.

Afterwards, the LED chip package body according to the first embodiment of the present invention as shown in FIG. 1 is obtained after a cutting process is performed on the LED wafer W. Since the side surfaces of the LED chip 1 are mostly covered with the fluorescent layer 41, the influence of the light from the side surface on which no fluorescent layer is formed on the color of the main light emitted from the LED chip 1 can be decreased.

Figure 4:
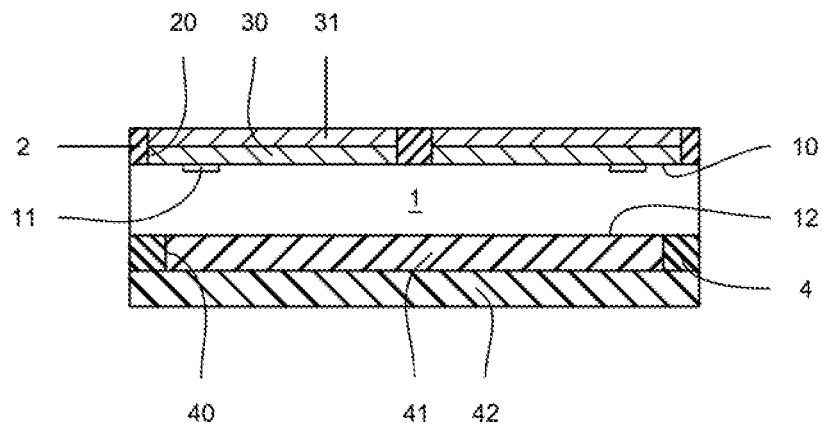
FIG. 4 is a schematic sectional view illustrating a light-emitting diode chip package body according to a second embodiment of the present invention.
Figure 5:
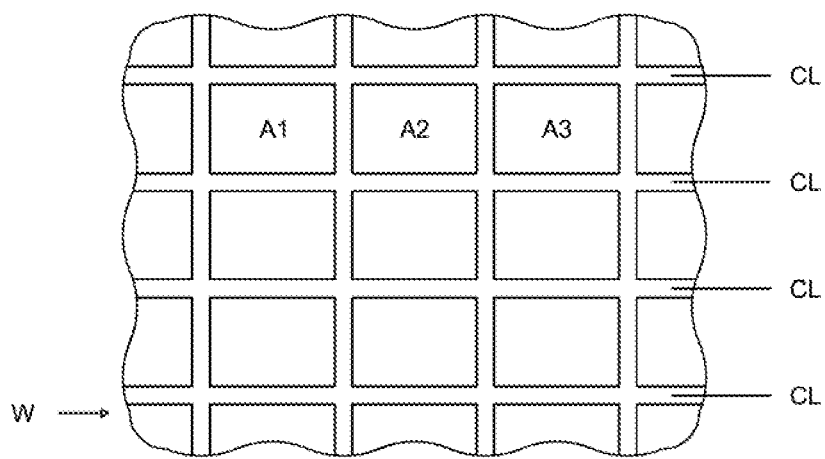
FIGS. 5 to 7 are schematic sectional views illustrating a method for manufacturing the light-emitting diode chip package body shown in FIG. 4.
Figure 6:
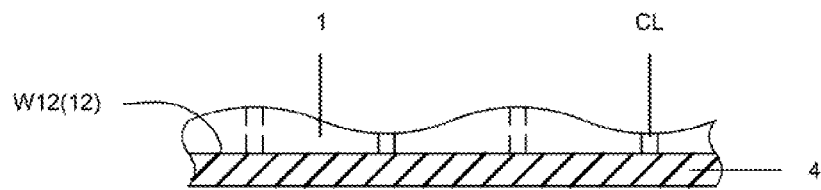
Figure 7:
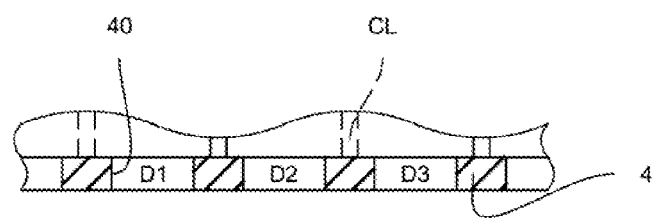

FIG. 4 is a schematic sectional view showing a LED chip package body according to a second embodiment of the present invention, and FIGS. 5 to 7 are schematic sectional views showing a method for manufacturing the LED chip package body shown in FIG. 4 in manufacturing steps.

It should be noted that since the formations of the insulating layer 2, the highly heat-dissipating layer 30 and the highly heat-conducting metal layer 31 are as same as those described in the first embodiment, the detailed description thereof is thus omitted.

Referring to FIGS. 4 to 7, a light-emitting surface-side insulating layer 4 is formed on the main light-emitting surface W12 of the LED wafer W. A plurality of vias 40 reaching the main light-emitting surface 12 (W12) of the corresponding LED chips 1 is formed in the insulating layer 4. A fluorescent layer 41 is formed in each via 40.

Next, a transparent protection layer 42 is formed on the surface of the insulating layer 4 and the fluorescent layer 41. Then, as shown in FIG. 4, the LED chip package body according to the second embodiment of the present invention is obtained after a cutting process.

Figure 8:
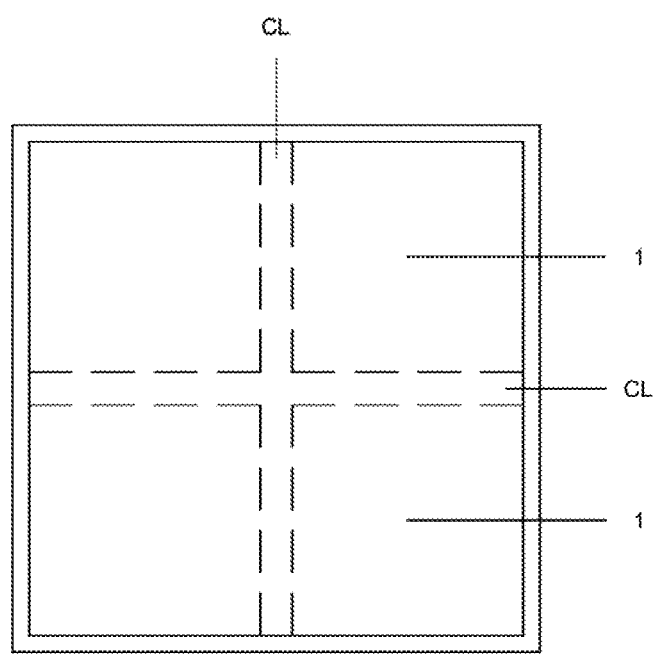
FIGS. 8 and 9 are schematic diagrams illustrating the state that each via exposes the main light-emitting surfaces of two or more LED chips.
Figure 9:
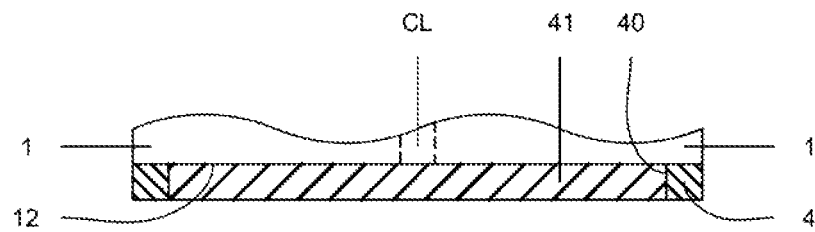

In the aforementioned description, although each via 40 exposes the main light-emitting surface 12 of a corresponding one of the chips, however, each via 40 can expose the main light-emitting surfaces 12 of two or more chips. Namely, each via 40 can expose 2×2, 3×3, 4×4, 5×5, . . . chips, as shown in FIGS. 8 and 9.

The LED chip package bodies manufactured by the method of the present invention will emit the light with same wavelength and same brightness, since the area A1, A2, A3, . . ., An (see FIG. 5) and the thickness D1, D2, D3, . . . , Dn (see FIG. 7) of the fluorescent layer 41 of the LED chips are the same and thus, high yield rate can be achieved. Further, the relative position of the fluorescent layer 41 formed on the light-emitting surface 12 of each LED chip 1 with respect to the corresponding LED chip 1 is same, the shape of the fluorescent layer 41 is same, and thus the aforementioned drawbacks associated with the conventional LED chip package body can be prevented.

Further, the height of the fluorescent layer 41 in the present invention depends on the height of the insulating layer 4. Therefore, the difference between the height of the fluorescent layer 41 in theory and the actual height of the fluorescent layer 41 can be suitably controlled.

Figure 10:
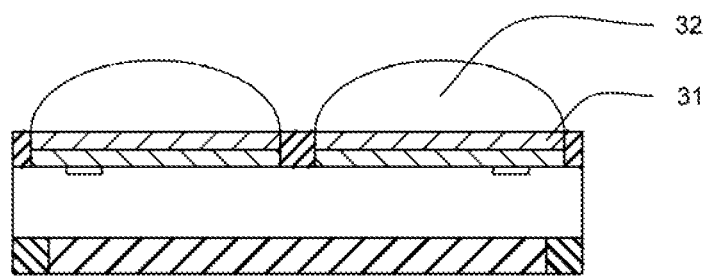
FIG. 10 is a schematic sectional view illustrating an alternative of the light-emitting diode chip package body according to the second preferred embodiment of the present invention.

Referring to FIG. 10, a solder ball 32 can be selectively formed on the metal layer 31.

Accordingly, the heat generated by the LED chip 1 can be quickly and efficiently dissipated because of the high heat conducting coefficient of the highly heat-dissipating layer 30 and the highly heat-conducting metal layer 31.

Figure 12A:
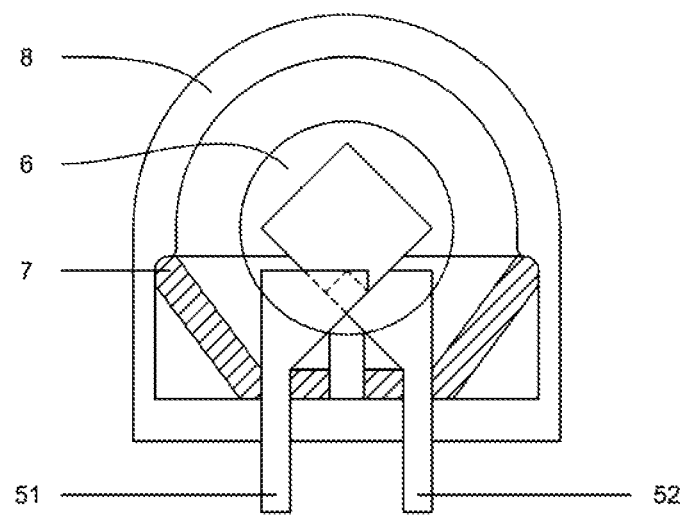
FIGS. 12(a) and 12(b) are schematic diagrams illustrating a light-emitting diode chip package body according to a third preferred embodiment of the present invention.
Figure 12B:
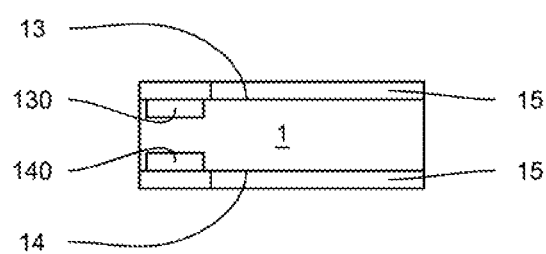

FIGS. 12(A) and 12(B) are schematic views showing a LED chip package body according to another embodiment of the present invention.

Referring to FIGS. 12(A) and 12(B), the LED chip package body includes a pair of terminals 51,52, a LED chip 1 supported by the terminals 51,52, a fluorescent layer 6 covering the LED chip 1, a reflector 7, and an lens 8.

The LED chip 1 has a first electrode-side surface 13 on which a first electrode 130 is formed, and a second electrode-side surface 14 on which a second electrode 140 is formed. The first electrode 130 and the second electrode 140 have opposite electrical polarity. The LED chip 1 is supported by the terminals 51,52 in the manner that the electrodes 130 and 140 on the first and second electrode side surfaces 13 and 14 of the LED chip 1 is in contact with the corresponding terminals 51,52. The surfaces 13,14 of the LED chip 1 is coated with a diamond-like carbon film 15. Therefore, heat inside the lens 8 can be efficiently dissipated through the terminals 51,52.

Figure 13A:
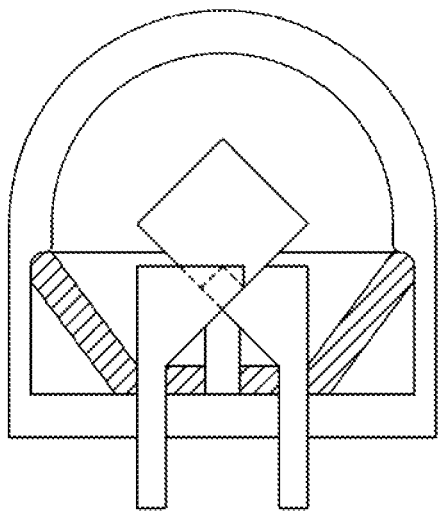
FIGS. 13(a) and 13(b) are schematic diagrams illustrating an alternative of the light-emitting diode chip package body according to the third preferred embodiment of the present invention.
Figure 13B:
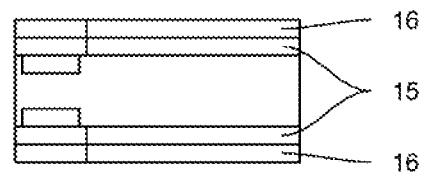

Referring to FIGS. 13(A) and 13(B), an alternative of the LED chip package body shown in FIG. 12(A) is shown. The difference between this alternative and the LED chip package body shown in FIG. 12(A) is that a fluorescent layer 16 is further coated on the diamond-like carbon film 15 such that the fluorescent layer 6 shown in FIG. 12(A) can be omitted.

Figure 14:
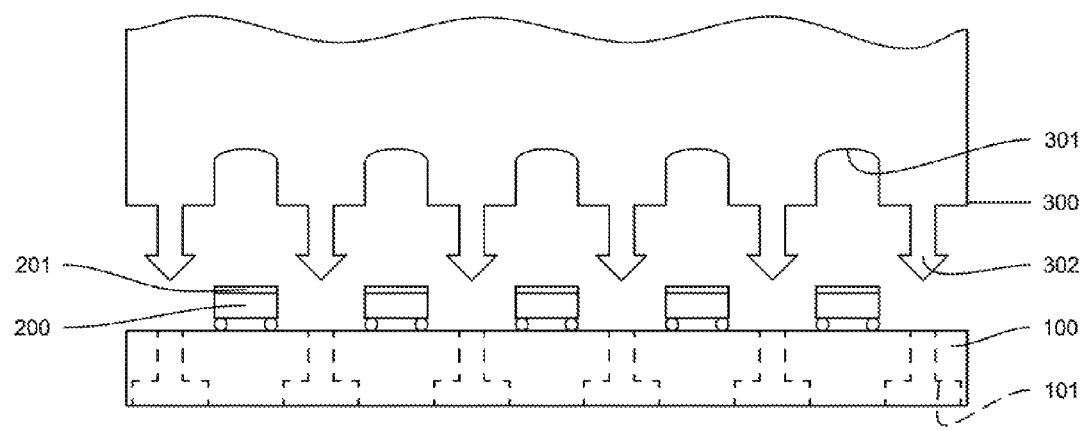
FIGS. 14 to 16 are schematic diagrams illustrating a light-emitting module using the light-emitting diode chip package body of the present invention.
Figure 15:
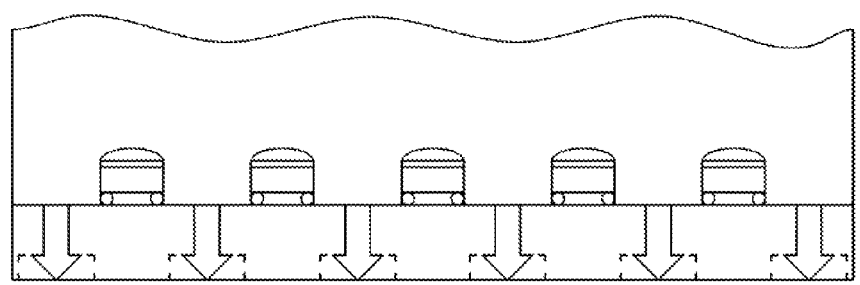

FIG. 14 is a schematic partial exploded view showing a light-emitting module, and FIG. 15 is a schematic assembly view showing the light-emitting module shown in FIG. 14.

Referring to FIG. 14, the light-emitting module includes a light-emitting assembly and a light-guiding assembly. The light-emitting assembly includes an elongated printed circuit board 100. A plurality of LED chip package bodies 200 is mounted on the printed circuit board 100 in Flip Chip manner. A fluorescent layer 201 is coated on the main light-emitting surface of each of the LED chip package bodies 200. A plurality of inverse-T shape though-holes 101 is formed in the printed circuit board 100.

The light-guiding assembly includes a diffusion plate 300. A plurality of recess portions 301 which is adapted to accommodate the corresponding LED chip package bodies 200 on the printed circuit board 100 and a plurality of hooks 302 are formed on a surface of the diffusion plate 300 facing the printed circuit board 100.

As shown in FIG. 15, when the hooks of the diffusion plate 300 are engaged with the corresponding though-holes 101 of the printed circuit board 100, the LED chip package bodies 200 on the printed circuit board 100 are accommodated in the corresponding recess portions 301, and the light emitted from the LED chip package bodies 200 transfer through the diffusion plate 300.

Figure 16:
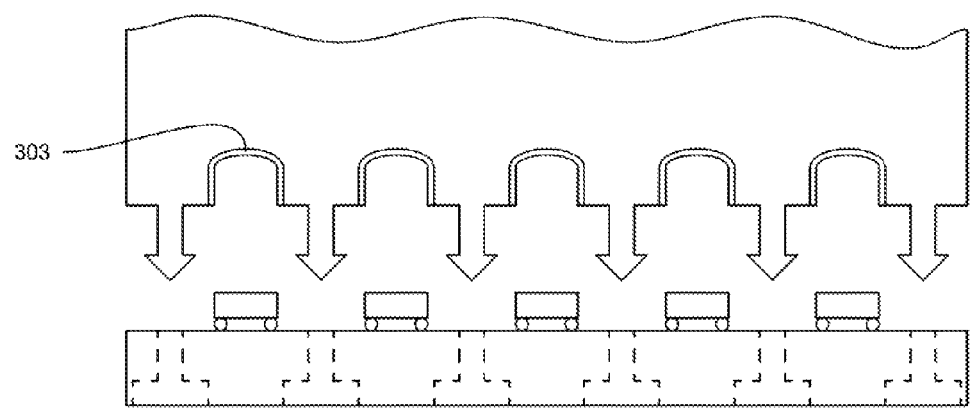

It should be noted that a fluorescent layer 303 (see FIG. 16) can be formed on an inner surface of each of the recess portions 301. As such, the fluorescent layer on the LED chip package body 200 can be omitted. Alternatively, the fluorescent layer 303 and the fluorescent layer on the LED chip package body 200 can exist simultaneously, so as to prevent the disadvantage of light emitting from the side surface on which no fluorescent layer is formed.

Figure 17:
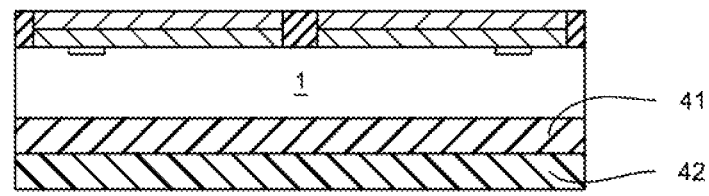
FIG. 17 is a schematic sectional diagram illustrating an alternative of the light-emitting diode chip package body according to the second embodiment of the present invention.

Referring now to FIG. 17, unlike to the second embodiment, no insulating layer is formed on the main light-emitting surface 12 of the LED chip 1 in the present embodiment. The fluorescent layer 41 is formed directly on the main light-emitting surface 12 of the LED chip 1.

Figure 18:
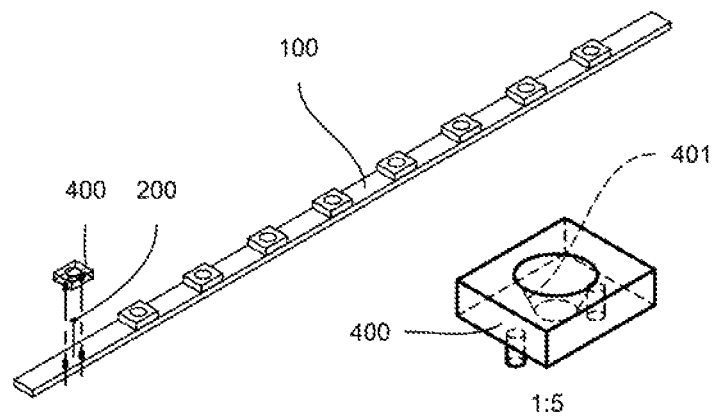
FIG. 18 is a schematic diagram illustrating a back-light module using the light-emitting diode chip package body shown in FIG. 17.
Figure 19:
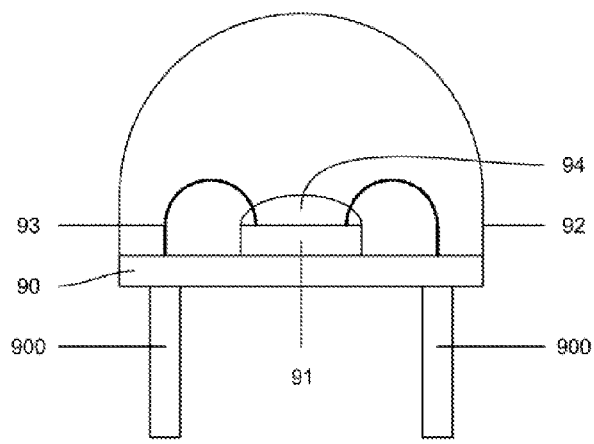
FIG. 19 is a schematic diagram illustrating a conventional light-emitting diode chip package body.
Figure 20:
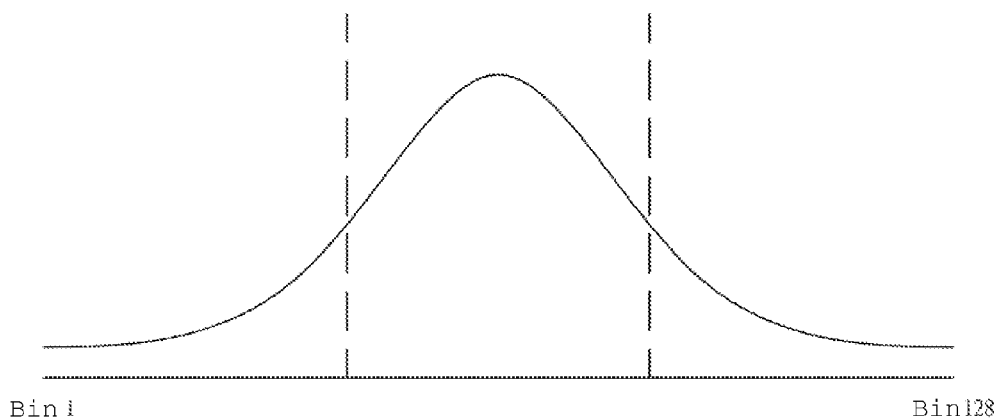
FIG. 20 is a schematic view showing the bin distribution of light-emitting diode chip package bodies in which the LED chips used have the same wavelength and same brightness.

FIG. 18 is a schematic perspective view showing the light-emitting module employing the LED chip package bodies shown in FIG. 17.

As shown in FIG. 18, the light-emitting module includes a printed circuit board 100, a plurality of LED chip package bodies 200, and a plurality of caps 400 doped with fluorescent powder. The LED chip package bodies 200 shown in FIG. 17 are mounted electrically on the printed circuit board 100. A tapered through-hole 401 is formed in each cap 400. The caps 400 are mounted on the printed circuit board 100 such that each of the LED chip package bodies 200 is surrounded by the wall confining the through-hole 401 of a corresponding one of the caps 400. As such, the light emitted from the side surface of the LED chip package body 200 will excite the fluorescent powder in the cap 400 so as to prevent the disadvantage of light emitting from the side surface on which no fluorescent layer is formed.

Figure 21:
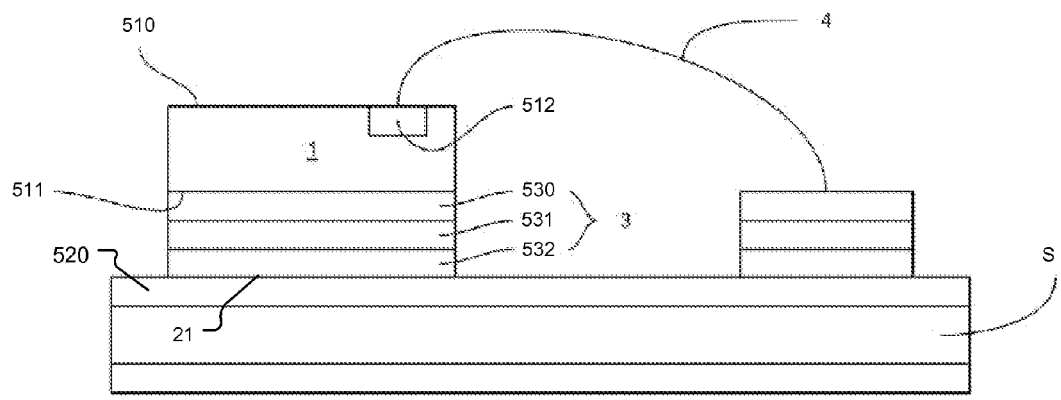
FIG. 21 is a schematic diagram illustrating a light-emitting diode chip package body according to a fourth preferred embodiment of the present invention.

Referring to FIG. 21, a LED chip 1 is mounted electrically on a substrate S. The LED chip 1 has a first surface 510 on which a first electrode 512 is formed, and a second surface 511 on which a second electrode (not shown) is formed. The LED chip 1 is mounted on a mounting surface 520 of the substrate S via a conductor layer 3 such that the second electrode of the LED chip 1 is connected electrically to the corresponding electrical contact (not shown) on the mounting surface 520 of the substrate S.

The conductor layer 3 includes a copper layer 532 formed on the mounting surface 520 of the substrate S, a gold layer 531 on the copper layer 532, and a solder layer 530 on the gold layer 531.

The copper layer 532 is connected to the mounting surface 520 of the substrate S with laser welding method or ultrasonic method.

The gold layer 531 is connected to the copper layer 532 with laser welding method.

The solder layer 530 is connected to the gold layer 531 with reflow method.

The first electrode 512 of the LED chip 1 is connected electrically to the conducting contact 21 on the mounting surface 520 of the substrate S. Each conducting contact 21 includes a copper layer 532 formed on the mounting surface 520 of the substrate S, a gold layer 531 on the copper layer 532, and a solder layer 530 on the gold layer 532.

Figure 22:
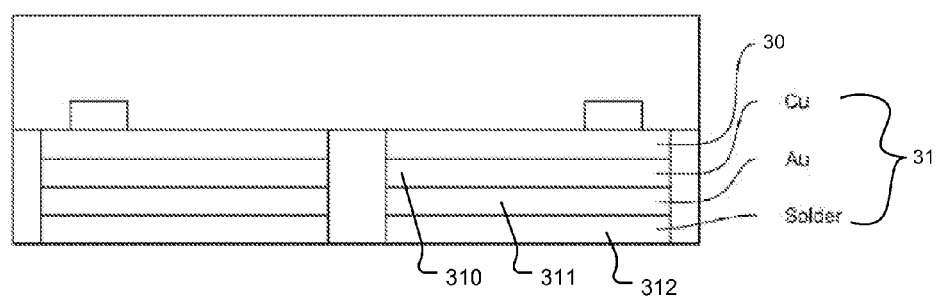
FIG. 22 is a schematic sectional diagram illustrating an alternative of the second preferred embodiment of the present invention.

Referring to FIG. 22, unlike to the first embodiment of the present invention, the highly heat-conducting metal layer 31 includes a copper layer 310 formed on the highly heat-dissipating layer 30 which is formed from pyrolytic graphite. The highly heat-dissipating layer 30 and the copper layer 310 can be formed by sputtering method. It should be noted that the removal of parts of the highly heat-dissipating layer 30 and the highly heat-conducting metal layer 31 can be achieved by a CMP (Chemical Mechanical Polishing) process.

The metal layer 31 further includes an Au layer 311 on the copper layer 310 and a solder layer 312 on the Au layer 311.

While this invention has been particularly shown and described with references to preferred embodiments thereof, it will be understood by those skilled in the art that various changes in form and details may be made therein without departing from the scope of the invention encompassed by the appended claims.

What is claimed is:

1. A LED chip package body, comprising:
   a pair of electrode terminals; and
   a LED chip having a first electrode-side surface on which a first electrode is formed and a second electrode-side surface on which a second electrode is formed, said first and second electrodes having opposite conductivity, said LED chip supported by said electrode terminals in a manner that said electrodes on said first and second electrode-side surfaces electrically contact with contact of corresponding electrode terminals, said electrode-side surface of said LED chip coated with a diamond-like film.

2. A LED chip package body as claimed in claim 1, wherein said diamond-like film has a heat-dissipating coefficient of 900 W/(m·k) to 1200 W/(m·k).

3. The LED chip package body as claimed in claim 1, wherein the first electrode side surface and the second electrode-side surface both extend in a direction that is parallel to the longitudinal axis of the electrode terminals.

4. The LED chip package body as claimed in claim 1, wherein both the first electrode-side surface and a second electrode-side surface are coated with the diamond-like film.

5. The LED chip package body as claimed in claim 1, wherein the first and second electrodes are attached to the first electrode-side surface and the second electrode-side surface, respectively.

6. The LED chip package body as claimed in claim 1, further comprising a cup-shaped reflector to reflect the light emitted from the LED chip and extending underneath the LED chip.

7. The LED chip package body as claimed in claim 1, further comprising a fluorescent layer coating the LED chip.

8. The LED chip package body as claimed in claim 7, further comprising a lens that surrounds the fluorescent layer and the LED chip.

9. The LED chip package body as claimed in claim 1, wherein both the first electrode-side surface and a second electrode-side surface are opposed to each other, coated with the diamond-like film, and exposed.

10. The LED chip package body as claimed in claim 8, wherein heat generated within lens is dissipated through the electrode terminals, which are connected to the first and second electrodes.

11. The LED chip package body as claimed in claim 8, wherein the LED chip is mounted on an edge and projects vertically toward the lens.

* * * * *